(12) United States Patent
Morita et al.

(10) Patent No.: US 10,177,528 B1
(45) Date of Patent: Jan. 8, 2019

(54) PACKAGE FOR MOUNTING LIGHT-EMITTING DEVICE

(71) Applicant: NGK SPARK PLUG CO., LTD., Nagoya, Aichi (JP)

(72) Inventors: Masahito Morita, Nagoya (JP); Kenji Suzuki, Ichinomiya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/029,738

(22) Filed: Jul. 9, 2018

(30) Foreign Application Priority Data

Jul. 10, 2017 (JP) .................................. 2017-134275
Jun. 1, 2018 (JP) .................................. 2018-105808

(51) Int. Cl.
*H01S 5/22* (2006.01)
*H01S 5/022* (2006.01)
*H01S 5/024* (2006.01)

(52) U.S. Cl.
CPC ...... *H01S 5/02212* (2013.01); *H01S 5/02276* (2013.01); *H01S 5/02469* (2013.01); *H01S 5/02284* (2013.01)

(58) Field of Classification Search
CPC ............. H01S 5/02212; H01S 5/02276; H01S 5/02469; H01S 5/02284
USPC ....................................................... 174/541
See application file for complete search history.

(56) References Cited

U.S. PATENT DOCUMENTS

| | | | |
|---|---|---|---|
| 6,111,199 A * | 8/2000 | Wyland ................. | H01L 23/055 174/18 |
| 6,242,694 B1 | 6/2001 | Muraki | |
| 2005/0207459 A1 * | 9/2005 | Yu ........................... | F25B 21/02 372/36 |
| 2009/0242926 A1 * | 10/2009 | Kimura ................. | H01L 23/055 257/99 |
| 2015/0108518 A1 * | 4/2015 | Samonji ................. | H01L 33/32 257/94 |
| 2015/0380895 A1 * | 12/2015 | Wong ................... | H01L 31/0203 257/432 |
| 2016/0120017 A1 | 4/2016 | Momoi et al. | |
| 2017/0291397 A1 | 10/2017 | Momoi et al. | |

FOREIGN PATENT DOCUMENTS

| | | |
|---|---|---|
| JP | H04-084475 A | 3/1992 |
| JP | H11-126840 A | 5/1999 |
| JP | 4058172 B2 | 3/2008 |
| JP | 2016-084528 A | 5/2016 |

* cited by examiner

*Primary Examiner* — Sherman Ng
(74) *Attorney, Agent, or Firm* — Stites & Harbison, PLLC; Jeffrey A. Haeberlin; James R. Hayne

(57) ABSTRACT

A light-emitting device mounting package includes a substrate, a lead pin supported on the substrate, and an insulating member having a facing front surface which faces the front surface of the substrate and a facing back surface. The substrate has a first through hole and the ceramic plate has a second through hole. The lead pin has a shaft portion which penetrates the first and second through holes, a head portion provided at one end of the shaft portion, and a collar portion which extends from the shaft portion in the radial direction. The lead pin is fixed, via the collar portion, to a region of the facing back surface of the ceramic plate around an opening of the second through hole, and the ceramic plate is fixed to a region of the front surface of the substrate around an opening of the first through hole.

6 Claims, 3 Drawing Sheets

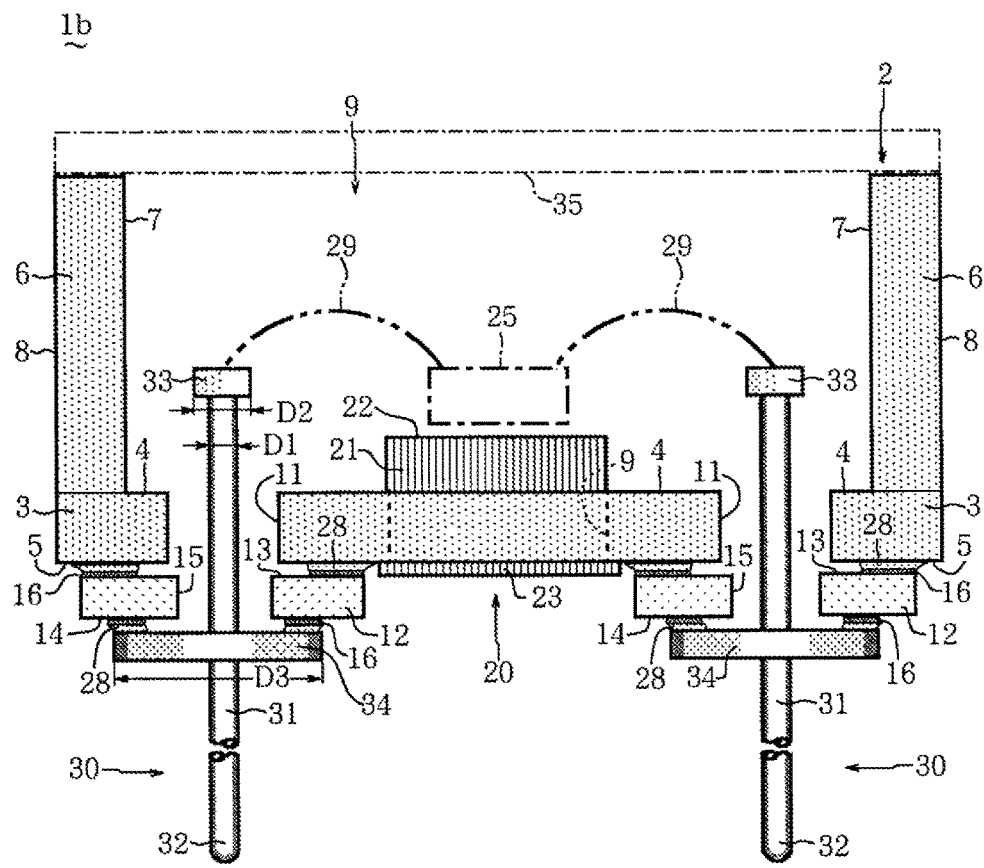
FIG. 6
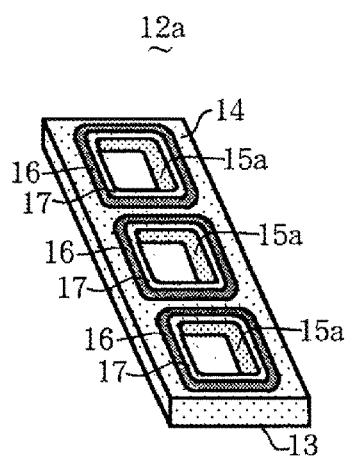 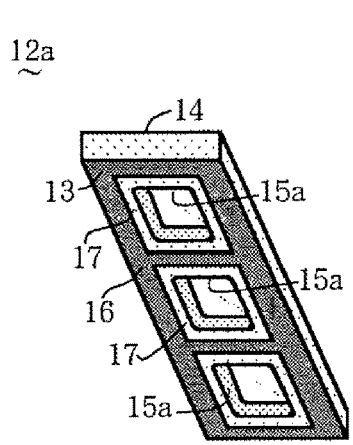
FIG. 7(A)  FIG. 7(B)

PACKAGE FOR MOUNTING LIGHT-EMITTING DEVICE

CROSS REFERENCE TO RELATED APPLICATIONS

The present application claims priority to Japanese Patent Application No. 2017-134275, which was filed on Jul. 10, 2017, and Japanese Patent Application No. 2018-105308, which was filed on Jun. 1, 2016, the disclosure of which is herein incorporated by reference in its entirety.

BACKGROUND OF THE INVENTION

Field of the Invention

The present invention relates to a package for mounting a light-emitting device (hereinafter also referred to as a "light-emitting device mounting package") used for mounting a light-emitting device such as a laser diode.

Description of Related Art

A package for optical communication disclosed in, for example. Patent Document 1 includes a base plate formed of metal; a frame which is joined to a front surface of the base plate, is formed of metal, and has a quadrangular shape in plan view; a holder insertion portion which is formed in one side wall of the frame and which is penetrated by a holder attached to one end of an optical fiber; a pair of ceramic substrates which are disposed in respective side walls located adjacent to the one side wall and facing each other and which individually penetrate the respective side walls; a plurality of conductor portions which are forced of tungsten or molybdenum, and extend between the inner and outer sides of the frame while penetrating the respective ceramic substrates; and a plurality of leads individually joined to the outer ends of the plurality of conductor portions.

In the case of the package for optical communication, electrical power is supplied to a light-emitting device through the conductor portions. Since the electrical resistance of the conductor portions formed of tungsten or the like is high, the electrical power supplied to the light-emitting device cannot be increased sufficiently.

Furthermore, since the ceramic substrates having the conductor portions are inserted into quadrangular through holes formed in the side walls of the frame and are fixed thereto, if the differences between the inner dimensions of the through holes and the outer dimensions of the ceramic substrates are not strictly controlled to fall within respective dimensional tolerances, a problem arises. Specifically, insertion of the ceramic substrates into the through holes becomes difficult, or excessively large gaps are formed between the ceramic substrates and the wall surfaces of the through holes, which results in a failure to maintain the gastightness of the interior space of the package.

Meanwhile, a hermetic package structure of a semiconductor laser pump module has been proposed in, for example, Patent Document 2. In the hermetic package structure, a plurality of relay terminals maintained in a horizontal attitude are caused to individually penetrate a plurality of through holes formed in a pair of mutually facing side walls of a rectangular parallelepiped box-shaped package formed of metal, and each of the gaps between the relay terminals and the wall surfaces of the through holes is sealed by glass solder or the like.

However, the above-described hermetic package structure has a problem in that, for each of the through holes formed in the side walls of the box-shaped package, a troublesome step must be performed so as to charge glass solder around the inserted relay terminal, as well as a problem of difficulty in stably maintaining gastightness.

RELATED ART DOCUMENTS

Patent Document 1 is Japanese Patent Application Laid-Open (kokai) No. H11-126840 (pages 3 to 5 and FIGS. 1 to 5).

Patent Document 2 is Japanese Patent Application Laid-Open (kokai) No. H04-84475 (pages 1 to 5 and FIGS. 1 to 8).

BRIEF SUMMARY OF THE INVENTION

An object of the present invention is to provide a light-emitting device mounting package which can solve the problems of the conventional techniques mentioned above; specifically, to provide a light-emitting device mounting package which can readily increase the amount of electric power supplied to a light-emitting device which is mounted inside the package at a later time and can reliably maintain the gastightness of the space inside the package.

In order to solve the above-described problems, the present invention has been accomplished on the basis of an idea of employing a structure in which a lead pin extends through a first through hole which penetrates a substrate constituting a package main body, and an insulating member which holds the lead pin and electrically insulates it from the outside is joined to a region of the substrate around one opening of the first through hole.

Namely, a package for mounting a light-emitting device of the present invention comprises: a substrate which has front and back surfaces facing in opposite directions and a mounting portion for a light-emitting device provided on the front surface side; a lead pin supported by the substrate; and an insulating member which has a facing front surface and a facing back surface, the facing front surface facing the front surface or the back surface of the substrate, and the facing back surface facing in a direction opposite a direction in which the facing front surface faces, wherein the substrate has a first through hole which extends between the front surface and the back surface and through which the lead pin extends; the insulating member has a second through hole which extends between the facing front surface and the facing back surface; the lead pin has a shaft portion which penetrates the first through hole and the second through hole, a collar portion which extends from the shaft portion in a radial direction, and a head portion provided at one axial end of the shaft portion; the collar portion of the lead pin has a diameter greater than a diameter of the shaft portion, and the head portion of the lead pin has a diameter greater than the diameter of the shaft portion; the lead pin is fixed, via the collar portion, to a region of the facing back surface of the insulating member around an opening of the second through hole; and the insulating member is fixed to a region of the front surface or the back surface of the substrate around an opening of the first through hole. In other words, the package includes: a substrate having a front surface and a back surface that, opposes the front surface, the substrate defining a first through hole which extends between the front, surface and the back surface, and the substrate including a mounting portion for a light-emitting device at a front surface side of the substrate. The package further includes an insulating member which has a facing front surface facing the front surface of the substrate or the back surface of the substrate and a facing back surface facing in a direction opposite a direction in which the facing front surface faces, the insulating member fixed to a region of the front surface of the substrate or a region of the back surface of the substrate around an opening of the first through hole, the insulating member defining a second through hole which extends between the facing front surface and the facing back surface. The package further includes a lead pin supported by the substrate, the lead pin including a shaft portion which penetrates the first through hole of the substrate and the second through hole of the insulating member, a collar portion which extends from the shaft portion in a radial direction, and a head portion provided at one axial end of the shaft portion. The lead pin is fixed, via the collar portion, to a region of the facing back surface of the insulating member around an opening of the second through hole. The collar portion of the lead pin has a diameter greater than a diameter of the shaft portion, and the head portion of the lead pin has a diameter greater than the diameter of the shaft portion.

The package for mounting a light-emitting device achieves the following advantageous effects (1) to (3).

(1) Since the lead pin successively penetrates the first through hole provided in the substrate and the second through hole provided in the insulating member, the lead pin can be electrically connected, through a bonding wire or the like, to the light-emitting device, which is mounted later on the mounting portion on the front surface side of the substrate. Accordingly, it is possible to supply a sufficient amount of current corresponding to an increased amount of electric power which must be supplied to the light-emitting device.

(2) The lead pin is fixed, via the collar portion extending in the radial direction thereof, to a region of the insulating member around the opening of the second through hole on the facing back surface side, and the insulating member is fixed to a region of the substrate around the first through hole. Therefore, the lead pin is supported by the substrate via two joining interfaces (flat surfaces); i.e., the joining interface between the collar portion and the facing back surface of the insulating member and the joining interface between the facing front surface of the insulating member and the front surface or back surface of the substrate. Accordingly, the gastightness of the space inside the package can be reliably and readily maintained without performing strict dimensional tolerance control which has been performed conventionally.

(3) Since the diameter of the head portion of the lead pin is set to be greater than the diameter of the shaft portion, when electrical connection with the light-emitting device, which is mounted on the mounting portion at a later time, is established using a bonding wire or the like, the connection region for the bonding wire can be made sufficiently large, thereby enabling easy and reliable joining.

Notably, the substrate may have a frame which will be described later. The substrate and the frame may be joined together (by means of brazing, welding, or the like). Alternatively, the substrate and the frame may be integrally formed as a single member which has a portion corresponding to the substrate and a portion corresponding to the frame. Such a member may be formed from a flat metal plate by means of plastic working such as press working or drawing. Alternatively, a box-shaped frame having a ceiling wall formed integrally therewith may be prepared separately from the substrate and joined to the substrate after mounting of the light-emitting device.

Examples of the light-emitting device include a laser diode (LD) and a light-emitting diode (LED).

The mounting portion for the light-emitting device may be an arbitrary region of the front surface of the substrate surrounded by an inner wall surface of the frame or a portion of the upper surface of the main body of a radiator which will be described later.

Each of the substrate, the lead pin, and the frame to be described later are formed of a metal such as, for example, Kovar (Fe-29% Ni-17% Co), so-called 42 alloy (Fe-42% Ni), or so-called 194 alloy (Cu-2.3% Fe-0.03% P).

A nickel film having a predetermined thickness and a gold film having a predetermined thickness are successively formed in this order on each of the surfaces of the substrate, the lead pin, and the frame to be described later, as well as a cover plate to be described.

The first through hole is one of a plurality of first through holes which extend straight between the front and back surfaces of the substrate in parallel to one another. Each of the first through holes may have a circular or quadrangular (square or rectangular) cross section. Alternatively, the first through hole may be a single first through hole which has an elliptical or rectangular cross section smaller than the outer shape of the insulating member and which a plurality of lead pins can penetrate.

The insulating member may be a ceramic member, a resin member, or a glass member.

Namely, the present invention encompasses a package for mounting a light-emitting device in which the insulating member is a ceramic member.

In the case where the insulating member is a ceramic member, the ceramic member is formed of, for example, a high-temperature-fired ceramic such as alumina, aluminum nitride, or mullite, or a low-temperature-fired ceramic such as glass-ceramic.

A metallized layer similar to the above-described metallized layer is formed on the facing back surface of the ceramic member such that the metallized layer surrounds an opening of the second through hole and is spaced from the opening.

The second through hole is one of a plurality of second through holes which are formed in the ceramic member such that the plurality of second through holes extend straight in parallel to one another. Each of the second through holes has a circular or quadrangular cross section, and the opening of each second through hole is spaced from the metallized layer.

The lead pin is fixed, via the collar portion extending in the radial direction thereof, to a region of the ceramic member around the opening of the second through hole on the facing back surface side, and the ceramic member is fixed, via the metalized layer, to a region of the substrate around the first through hole of the substrate. Therefore, the lead pin is joined to the substrate via two joining interfaces (flat surfaces); i.e., the joining interface between the collar portion and the facing back surface of the ceramic member and the joining interface between the facing front surface of the ceramic member and the front surface or back surface of the substrate. Accordingly, the gastightness of the space inside the package can be reliably and readily maintained without performing strict dimensional tolerance control which has been performed conventionally.

In the case where the insulating member is a resin member or a glass member, for example, polyimide-based or epoxy-based resin, borosilicate glass, quarts glass, or the like is used.

The lead pin is fixed, via the collar portion extending in the radial direction thereof, to a region of the resin member or the glass member around the opening of the second through hole on the facing back surface side, and the resin member or the glass member is fixed, via an adhesive, to a region of the substrate around the first, through hole of the substrate. Therefore, the lead pin is joined to the substrate via two joining interfaces (flat surfaces); i.e., the joining interface between the collar portion and the facing back surface of the resin member or the glass member and the joining interface between the facing front surface of the resin member or the glass member and the front surface or back surface of the substrate. Accordingly, in this case as well, the gastightness of the space inside the package can be reliably and readily maintained without performing strict dimensional tolerance control which has been performed conventionally. Notably, the above-mentioned adhesive may be a resin-based adhesive or a glass-based adhesive.

The present invention encompasses a package for mounting a light-emitting device in which the ceramic member is fixed to the substrate via a metallized layer formed on the facing front surface of the ceramic member such that the metallized layer surrounds an opening of the second through hole and is spaced from the opening, and a brazing material layer disposed on and along the metallized layer.

In this case, the ceramic member is firmly joined to the substrate via the metallized layer and the brazing material layer. In addition to the above-described advantageous effect (2), the following advantageous effect (4) can be obtained.

(4) The metallized layer formed on the facing front surface of the ceramic member is spaced from the opening of the second through hole which is open to the facing front surface. Therefore, when the ceramic member is fixed to the region of the front surface or back surface of the substrate around the first through hole, troubles such as formation of a short circuit are less likely to occur. Such troubles would otherwise occur when the brazing material layer disposed on and along the metallized layer accidentally comes into contact with the lead pin.

Notably, the metallized layer is formed of tungsten (hereinafter simply denoted as W), molybdenum (hereinafter simply denoted as Mo), or the like.

An example of the material used to form the brazing material layer is silver brazing material (e.g., Ag—Cu alloy).

The present invention encompasses a package for mounting a light-emitting device in which the mounting portion for the light-emitting device is separated from the substrate and is a portion of a radiator which is higher in thermal conductivity than the substrate (i.e., the radiator has a thermal conductivity higher than a thermal conductivity of the substrate); and the substrate has (defines) a third through hole which extends between the front surface and the back surface and into which the radiator is fixedly inserted.

In the case, the radiator having the mounting portion for the light-emitting device is higher in thermal conductivity than the substrate and is fixedly inserted into the third through hole. Therefore, the heat generated by the light-emitting device, which is mounted on the mounting portion at a later time, can be effectively radiated to the outside of the package through the radiator (hereinafter, this effect will be referred to as the advantageous effect (5)).

Notably, the radiator is formed of, for example, copper, a copper alloy, an aluminum alloy, or the like.

The present invention encompasses a package for mounting a light-emitting device in which the third through hole has a rectangular shape, a square shape, or a circular shape in plan view; and the radiator has a rectangular parallelepiped shape, a cubic shape, or a circular columnar shape and has (includes) a flange which extends along a periphery of a bottom surface of the radiator and which can be joined to a region of the back surface of the substrate around an opening of the third through hole.

In this case, the flange of the radiator, which is integrally formed along the periphery of the bottom surface of the main body hereof, is joined, via a brazing material or the like, to a region of the back surface of the substrate around the opening of the third through hole. Therefore, the above-described advantageous effects (2) and (5) can be achieved without fail.

The present invention encompasses a package for mounting a light-emitting device in which the difference in coefficient of linear expansion between the substrate and the ceramic member is 5 ppm ($K^{-1}$) or less.

In this case, since the difference in coefficient of linear expansion between the ceramic member and the substrate is relatively small; i.e., equal to or smaller than 5 ppm ($K^{-1}$), the thermal stress acting on the joining interface between the ceramic member and the substrate is reduced. Therefore, the above-described advantageous effect (2) can be achieved more reliably.

BRIEF DESCRIPTION OF THE DRAWINGS

Illustrative aspects of the invention will be described in detail with reference to the following figures wherein:

FIG. 6 is a vertical sectional view corresponding to FIG. 5 and showing a light-emitting device mounting package according to a second embodiment of the present invention.

FIG. 7(A) is a perspective view showing a facing back surface side of a ceramic plate according to a third embodiment, and FIG. 7(B) is a perspective view showing a facing front surface side of the ceramic plate according to the third embodiment.

DETAILED DESCRIPTION OF EXEMPLARY EMBODIMENTS OF THE INVENTION

Embodiments of the present invention will now be described.

Figure 1:
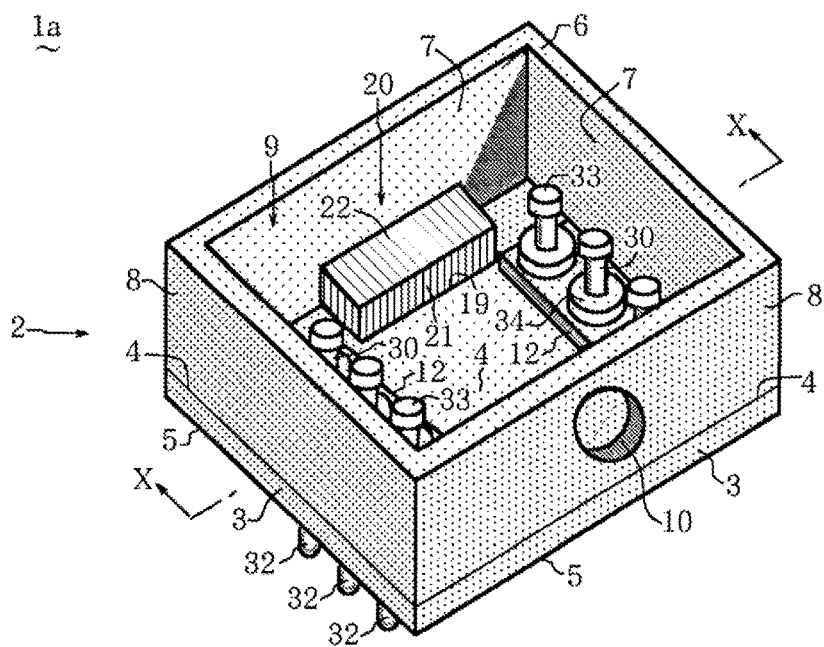
FIG. 1 is an upper perspective view of a light-emitting device mounting package according to a first embodiment of the present invention.
Figure 2:
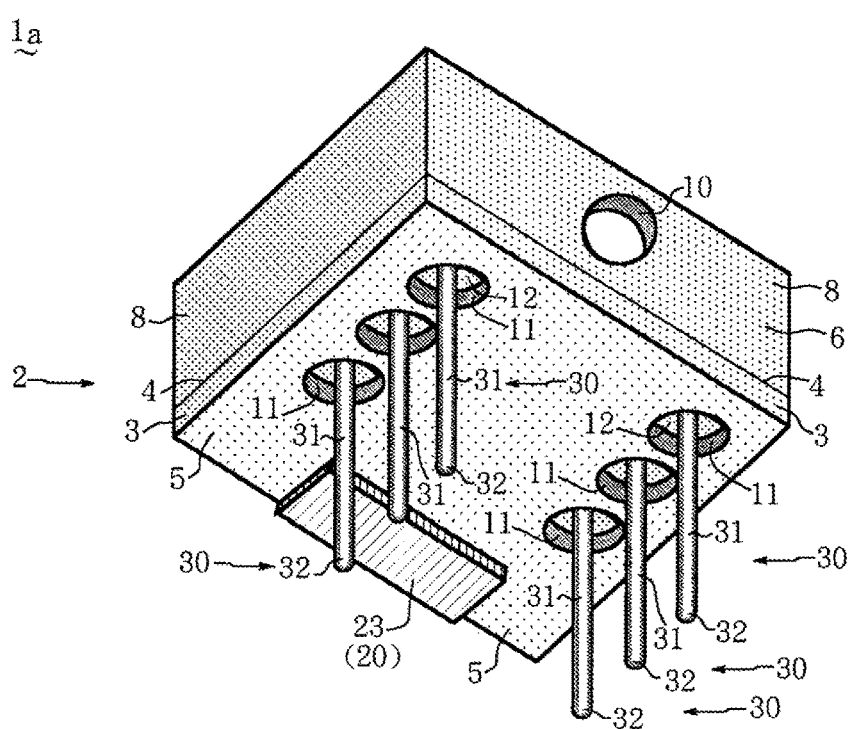
FIG. 2 is a lower perspective view of the light-emitting device mounting package according to the first embodiment of the present invention.

FIGS. 1 and 2 are upper and lower perspective views of a light-emitting device mounting package 1a according to a first embodiment of the present invention.

As shown in FIGS. 1 and 2, the light-emitting device mounting package 1a includes a package main body 2 which has a box like shape as a whole, a pair of ceramic plates (ceramic members, insulating members) 12 disposed inside the package main body 2, and a plurality of lead pins 30 which successively penetrate the ceramic plates 12 and a substrate 3 of the main body 2. Upper ends (first ends) of the lead pins 30 are located in a cavity 9 inside the package main body 2.

The package main body 2 is composed of the flat substrate 3 which has a front surface 4 and a back surface 5 facing upward and downward, respectively, and a frame 6 which extends upward from the periphery of the front surface 4 of the substrate 3 and which has an inner wall surface 7 and an outer wall surface 8 each having a quadrangular (square or rectangular) shape in plan view. The front surface 4 of the substrate 3 surrounded by the inner wall surface 7 of the frame 6 has a mounting portion for an unillustrated light-emitting device. Alternatively, the mounting portion is a portion of a radiator which will be described later.

Notably, the substrate 3 and the frame 6 are formed of, for example, Kovar and are joined together by means of brazing or the like, thereby forming the package main body 2. A nickel film and a gold film each having a predetermined thickness are successively formed on the entire surface of the package main body 2. The cavity 9 having a rectangular parallelepiped shape as a whole is surrounded by the front surface 4 of the substrate 3 and the inner wall surface 7 of the frame 6.

The substrate 3 has three first through holes 11 arranged in a horizontal row along each of a pair of sides which face each other in plan view. The first, through holes 11 extend parallel to each other between the front surface 4 and the back surface 5.

A third through hole 19 having a rectangular shape in plan view is formed on the rear side (far side) of the substrate 3 in FIGS. 1 and 2 such that the third through hole 19 extends along the side wall of the frame 6. A main body 21 of a radiator 20 is inserted into the third through hole 19 from the back surface 5 side of the substrate 3 and is fixed to the substrate 3.

Figure 4:
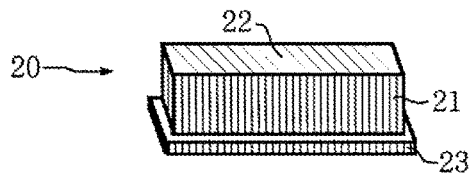
FIG. 4 is a perspective view of a radiator used in the light-emitting device mounting package.

The radiator 20 is formed of a metal, such as copper, which is higher in heat conductivity than the substrate 3. As shown in FIG. 4, the radiator 20 is composed of the rectangular parallelepiped main body 21 having an upper surface 22, a portion of which is used as the light-emitting device mounting portion, and a flange 23 which protrudes from the main body 21 along the circumference of the bottom surface of the main body 21. The flange 23 is joined to the back surface 5 of the substrate 3 via an unillustrated brazing material.

The frame 6 has a through hole 10 formed in the side wall thereof located on the front side in FIGS. 1 and 2. The through hole 10 extends between the inner wall surface 7 and the outer wall surface 8 of the side wall. Light such as laser light is caused to pass through the through hole 10, or an unillustrated optical fiber is inserted into the through hole 10.

Figure 3A:
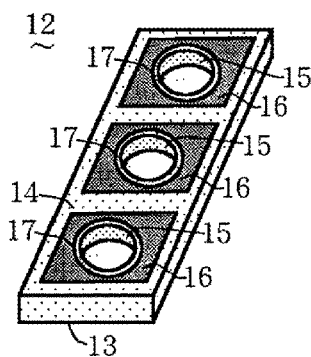
FIG. 3(A) is a perspective view showing a facing back surface side of a ceramic plate used in the package.
Figure 3B:
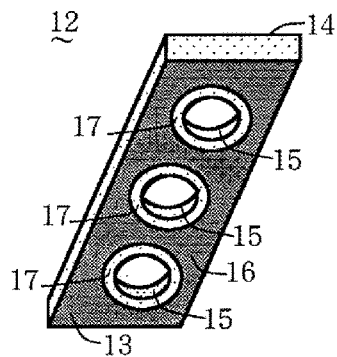
FIG. 3(B) is a perspective view showing a facing front surface side of the ceramic plate used in the package.

The ceramic plates (ceramic members) 12 are formed of, for example, ceramic such as alumina. As shown in FIGS. 3(A) and 3(B), each of the ceramic plates 12 has a facing front surface 13 which faces the front surface 4 of the substrate 3, a facing back surface 14 which faces in a direction opposite a direction in which the facing front surface 13 faces, and three circular second through holes 15 which extend between the facing front surface 13 and the facing back surface 14.

As shown in FIG. 3(A), the facing back surface 14 has annular separation regions 17 which are provided around the openings of the second through holes 15 and in which the surface of alumina is exposed and a plurality of quadrangular metallized layers 16 which are formed of W or Mo and which individually surround the respective separation regions 17. As shown in FIG. 3(B), the facing front surface 13 has annular separation regions 17 which are the same as those of the facing back surface 14 and which are provided around the openings of the second through holes 15. A metallized layer 16 is formed on substantially the entirety of the facing front surface 13, excluding the separation regions 17. Notably, each of the metallized layers 16 is formed to be spaced from the openings of the second through holes 15 and to exist between the second through holes 15 located adjacent to each other.

Notably, the difference in coefficient of linear expansion between alumina used to form the ceramic plates 12 and Kovar used to form the substrate 3 and the frame 6 is 5 ppm ($K^{-1}$) or less.

Figure 5:
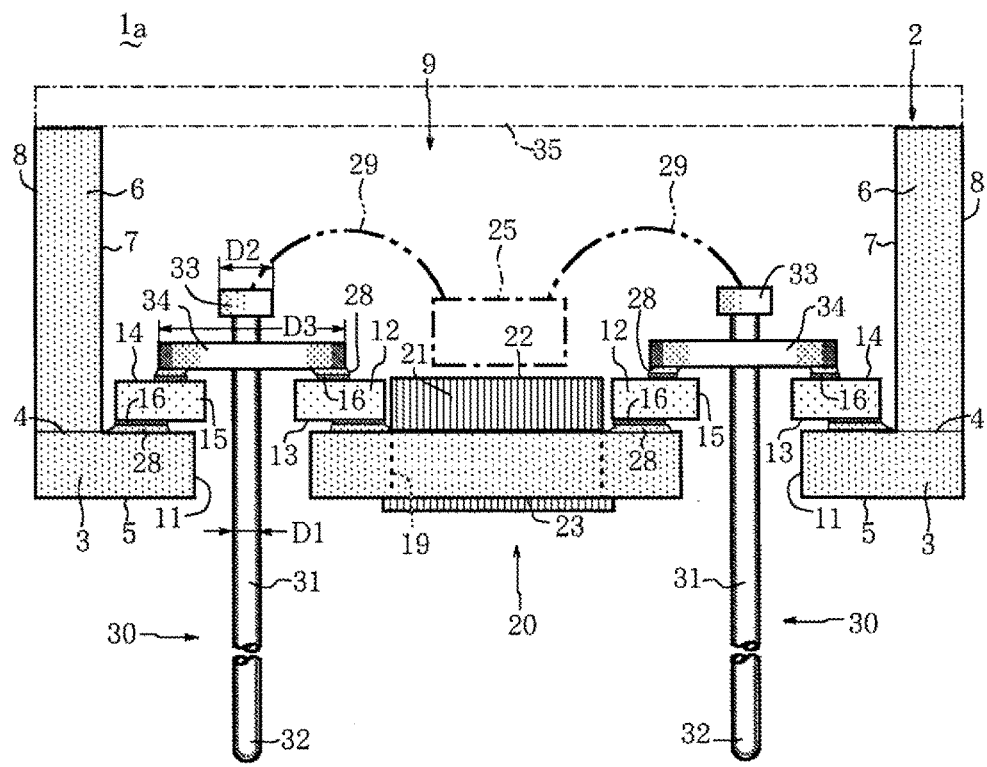
FIG. 5 is a vertical sectional view taken along line X-X in FIG. 1.

The lead pins 30 are formed of, for example, Kovar. As shown in FIGS. 1, 2, and 5, each of the lead pins 30 has a shaft portion 31 having the shape of a round bar, a semispherical distal end portion 32 located at the lower end of the shaft portion 31, a circular columnar head portion 33 provided at the upper end (first end) of the shaft portion 31, and a disk-shaped collar portion 34 which radially extends from the shaft portion 31 at a position near the head portion 33. As shown in FIG. 5, in each of the lead pins 30, the diameter D3 of the collar portion 34 is greater than the diameter D1 of the shaft portion 31, and the diameter D2 of the head portion 33 is also greater than the diameter D1 of the shaft portion 31.

Notably, a nickel film and a gold film which are the same as the above-described nickel and gold films are successively formed on the surface of each lead pin 30.

As shown in FIGS. 1, 2, and 5, in each of a region around the openings (on the front surface 4 side) of the three first through holes 11 on the left side of the substrate 3 and a region around the openings of the three first through holes 11 on the right side of the substrate 3, each of the ceramic plates 12 is individually joined to the front surface 4 of the substrate 3, via the metallized layer 16 formed on the facing front surface 13 of the ceramic plate 12 and a brazing material layer 28 disposed on and along the metallized layer 16 (along the lower surface thereof in the drawings).

As shown in FIG. 5, each lead pin 30 is disposed such that the shaft portion 31 of the lead pin 30 penetrates a center portion of the corresponding second through hole 15 of the corresponding ceramic plate 12. The flange portion 34 of the lead pin 30 is joined to and fixed to the facing back surface 14 of the ceramic place 12 via the metallized layer 16 formed around the opening of the second through hole 15 with the separation region 17 intervening therebetween, and a brazing material layer 28 disposed on and along the metallized layer 16.

Notably, the brazing material, layer 28 is formed of, for example, a silver brazing material (Ag—Cu alloy).

As a result, the lead pins 30 are supported by the substrate 3 via the ceramic plates 12 such that the lead pins 30 successively penetrate the center portions of the respective first through holes 11. of the substrate 3 and the center portions of the respective second through holes 15 of the ceramic plates 12.

As shown in FIGS. 1, 2, and 5, the main body 21 of the radiator 20 is inserted into the third through hole 15 of the substrate 3 from the back surface 5 side of the substrate 3, and the radiator 20 is fixed to the substrate 3 via a brazing material (not shown) which is the same as the above-described brazing material and which is disposed between the flange 23 of the radiator 20 and the back surface 5 of the substrate 3.

As shown FIG. 5, the upper surface 22 of the main body 21 of the radiator 20 has a mounting portion for a laser diode (light-emitting device) 25 to be mounted at a later time. A plurality of externa- electrodes (not shown) provided on the upper surface of the laser diode 25 mounted on the mounting portion are electrically connected to the head portions 33 of the lead pins 30 though bonding wires 29.

A cover plate 35 formed of, for example, Kovar is joined to the upper opening portion of the frame 6 by means of brazing or the like, whereby the cavity 9 of the package main body 2 including the mounted laser diode 25 is sealed from the outside environment.

FIG. 6 is a vertical sectional view corresponding to FIG. 5 and showing a light-emitting device mounting package 1*b* according to a second embodiment of the present invention, which differs in configuration from the above-described package 1*a*.

As shown in FIG. 6, the light-emitting device mounting package 1*b* includes a package main body 2 composed of a substrate 3 and a frame 6 which are the same as the above-described substrate and frame; a plurality of first through holes 11 which extend between the front surface 4 and the back surface 5 of the substrate 3 in the same manner as in the above-described embodiment; a pair of ceramic plates 12 which are joined, in the same manner as in the above-described embodiment, to regions around the openings of the first through holes 11 on the back surface 5 side of the substrate 3; and a plurality of lead pins 30 which individually and successively penetrate the center portions of the respective second through holes 15 of the ceramic plates 12 and the center portions of the respective first through holes 11 of the substrate 3.

As shown in FIG. 6, each of the lead pins 30 has a shaft portion 31, a distal end portion 32, and a head portion 33 which are the same as those in the above-described embodiment, and also has a collar portion 34 which is the same as the collar portion in the above-described embodiment and is provided on the shaft portion 31 at an intermediate position in the axial direction.

As shown in FIG. 6, in each of a region around the openings (on the back surface 5 side) of the plurality of first through holes 31 on the left side of the substrate 3 and a region around the openings (on the back surface 5 side) of the plurality of first through holes 11 on the right side of the substrate 3, each of the ceramic plates 12 is individually joined to the back surface 5 of the substrate 3, via the metallized layer 16 formed on the facing front surface 13 of the ceramic plate 12 and a brazing material layer 28 disposed on and along the metallized layer 16.

As shown in FIG. 6, each lead pin 30 is disposed such that the shaft portion 31 of the lead pin 30 penetrates a center portion of the corresponding second through hole 15 of the corresponding ceramic plate 12. The flange portion 34 of the lead pin 30 is joined to and fixed to the facing back surface 14 of the ceramic plate 12 via the metallized layer 16 formed around the opening (on the facing back surface 14) of the second through hole 15 with the separation region 17 intervening therebetween, and a brazing material layer 28 disposed on and along the metallized layer 16 (along the lower surface thereof in the drawing).

As a result, the lead pins 30 are supported by the substrate 3 via the ceramic plates 12 such that the lead pins 30 successively penetrate the center portions of the respective first through holes 11 of the substrate 3 and the center portions of the respective second through holes 15 of the ceramic plates 12.

As shown in FIG. 6, the main body 21 of the radiator 20 is inserted into the third through hole 19 of the substrate 3, and the radiator 20 is fixed to the substrate 3 via a brazing material (not shown) which is the same as the above-described brazing material and which is disposed between the flange 23 of the radiator 20 and the back surface 5 of the substrate 3.

As shown FIG. 6, the upper surface 22 of the main body 21 of the radiator 20 has a mounting portion for a laser diode 25 to be mounted at a later time. A plurality of external electrodes (not shown) provided on the upper surface of the laser diode 25 mounted on the mounting portion are electrically connected to the head portions 33 of the lead pins 30 though bonding wires 29.

A cover plate 35 formed of, for example, Kovar is joined to the upper opening portion of the frame 6 by means of brazing or the like, whereby the cavity 9 of the package main body 2 including the mounted laser diode 25 is sealed from the outside environment.

In the above-described light-emitting device mounting packages 1*a* and 1*b*, since the lead pins 30 successively penetrate the first through holes 11 of the substrate 3 and the second through holes 15 of the ceramic plates 12, the lead pins 30 can be electrically connected, through the bonding wires 29, to the laser diode 25, which is mounted later on the mounting portion of the upper surface 22 of the radiator 20 located on the front surface 4 side of the substrate 3. Accordingly, it is possible to supply a sufficient amount of current corresponding to an increased amount of electric power which must be supplied to the laser diode 25.

The lead pins 30 are fixed, via their collar portions 34, to respective regions of the ceramic plates 12 around the openings of the second through holes 15 on the facing back surface 14 side, and the ceramic plates 12 are fixed, via the metallized layers 16 and the brazing material layers 28, to respective regions of the substrate 3 around the first through holes 11 of the substrate 3. Therefore, each of the lead pins 30 is supported on the substrate via two joining interfaces (flat surfaces); i.e., the joining interface between the collar portion 34 and the facing back surface 14 of the ceramic plate 12 and the joining interface between the facing front surface 13 of the ceramic; plate 12 and the front surface 4 or back surface 5 of the substrate 3. Accordingly, the gastightness of the space inside the package main body 2 can be reliably and readily maintained without performing strict dimensional tolerance control which has been performed conventionally.

The metallized layer 16 formed on the facing front surface 13 of each ceramic plate 12 is spaced from the openings of the second through hole 15 which are open to the facing front surface 13, with the separation regions 17 intervening between the metallized layer 16 and the openings. Therefore, when the ceramic plates 12 are fixed to the regions of the front surface 4 or back surface 5 of the substrate 3 around the first through holes 11, troubles such as formation of a short circuit are less likely to occur. Such troubles would otherwise occur when the brazing material layer 28 disposed on and along the metallized layer 16 accidentally comes into contact with the lead pins 30.

The radiator 20 having the mounting portion for the laser diode 25 is higher in heat conductivity than the substrate 3, and is inserted into the third through hole 19 and fixed to the substrate 3. Therefore, the heat generated by the laser diode 25, which is mounted on the mounting portion at a later time, can be effectively radiated to the outside through the radiator 20.

Since the difference in coefficient of linear expansion between the ceramic plates 12 and the substrate 3 and the frame 6 is relatively small; i.e., equal to or smaller than 5 ppm ($K^{-1}$), the thermal stress acting on the joining interfaces between the ceramic plates 12 and the substrate 3 is reduced, and an unnecessary gap becomes less likely to be formed. Therefore, the gastightness of the spaces inside the present packages 1a and 1b can be reliably and readily maintained.

Since the diameter D2 of the head portion 33 of each lead pin 30 is set to be greater than the diameter D1 of the shaft portion 31, when electrical connection with the light-emitting device 25, which is mounted on the mounting portion 22 at a later time, is established using the bonding wires 29 or the like, the connection regions for the bonding wires 29 can be made larger, which allows easy and reliable joining.

Accordingly, the light-emitting device mounting packages 1a and 1b can achieve the above-described advantageous effects (1) through (5) without fail.

In the case of the light-emitting device mounting package 1a of the first embodiment, since the ceramic plates 12 are disposed in the cavity 9, the height of the package 1a can be reduced in spite of its structure in which the ceramic plates 12 are surface-joined to the substrate 3 so as to secure gastightness.

FIGS. 7(A) and (B) are perspective views of a ceramic plate (ceramic member) 12a according to a third embodiment of the present invention as viewed from the facing back surface 14 side and the facing front surface 13 side, respectively. The ceramic plate 12a is formed of, for example, alumina which is the same as that used in the first and second embodiments. As shown in FIGS. 7(A) and 7(B), the ceramic plate 12a has a facing front surface 13 which faces the front surface 4 of the substrate 3, a facing back surface 14 which faces in a direction opposite a direction in which the facing front surface 13 faces, and three second through holes 15a which extend between the facing back surface 14 and the facing front surface 13. The second through holes 15a have a quadrangular shape in plan view.

As shown in FIG. 7(A), the facing back surface 14 has quadrangular separation regions 17 which are provided around the openings of the second through holes 15a and in which the surface of alumina is exposed and quadrangular metallized layers 16 which are formed of W or Mo and which individually surround the respective separation regions 17. As shown in FIG. 7(B), the facing front surface 13 has quadrangular separation regions 17 which are the same as those of the facing back surface 14 and which are provided around the openings of the second through holes 15a. A metallized layer 16 is formed on substantially the entirety of the facing front surface 13, excluding the separation regions 17.

Notably, the difference in coefficient of linear expansion between alumina used to form the ceramic plate 12a and Kovar used to form the substrate 3 and the frame 6 is 5 ppm ($K^{-1}$) or less.

In place of the above-described ceramic plate 12, the ceramic plate 12a can be similarly applied to the light-emitting device mounting packages 1a and 1b, and the above-described packages 1a and 1b in which the ceramic plate 12a is used can achieve the above-described advantageous effects (1) to (5).

The present invention is not limited to the above-described embodiments.

For example, the substrate 3, the frame 6, the lead pins 30, and the cover plate 35 may be formed of 42 alloy or 194 alloy.

The ceramic plates 12 and 12a may be formed of any one selected from aluminum nitride, mullite, and glass-ceramic, or may be formed of a resin plate (resin member) or a glass plate (glass member). In the case where the ceramic plates 12 and 12a are replaced with resin plates or glass plates, the metallized layers 16 are omitted. In the case where resin plates or glass plates are used, a resin-based adhesive or a glass-based adhesive is used for bonding the plates to the substrate 3 and the lead pins 30.

In the light-emitting device mounting packages 1a and 1b, the substrate 3 may have a single first through hole which is provided for each of the ceramic plates 12 and 12a and which has a rectangular cross section which is similar to the outer shape of the ceramic: plates 12 and 12a.

The frame 6 may be integrated with the cover plate 35 and partially constitute a box-shaped body having an opening portion which is located on the bottom surface side and which surrounds the front surface 4 of the substrate 3.

The light-emitting device may be a light-emitting diode or the like.

A cylindrical holder for holding an optical fiber which has the same inner diameter as the through hole 10 may be provided on the outer wall surface 3 side of the through hole 10 of the frame 6.

The third through hole may have a circular shape, an elliptical shape, or a flat oval shape in plan view, and the main body of the radiator 20 may have a shape, in plan view, which is similar to the shape of the third through hole, for example, the circular shape.

The collar portion 34 of each lead pin 30 may have a quadrangular shape in plan view.

Any of alumina, silicic acid, boron oxide, zinc oxide, lead oxide, calcia, palladium, platinum, copper, gold, and carbon may be used for the brazing material (joining material) layer.

The diameter D2 of the head portion 33 of each lead pin 30 may be set to be smaller than the diameter D3 of the collar portion 34. Namely, the diameter D3 of the collar portion 34 of each lead pin 30 may be set to be the largest. In this case, since the collar portion 34 can have a sufficiently large area, the joining between the collar portion 34 and the ceramic plate 12 can be secured sufficiently, whereby more reliable gastight sealing can be realized.

The diameter D2 of the head portion 33 of each lead pin 30 may be set to be larger than the diameter D3 of the collar portion 34. Namely, the diameter D2 of the head portion 33 may be set to be the largest. In this case, since the head portion 33 can have a sufficiently large area, the bonding wires 29 or the like can be easily joined to the lead pins 30 in order to establish electrical connection between the lead pins 30 and the light-emitting device 25, which is mounted at a later time.

In the light-emitting device mounting package 1b, recesses whose depth is equal to or greater than the thickness of the ceramic plate 12 may be formed in the back surface 5 of the substrate 3, and the ceramic plates 12 may be joined to the bottoms of the recesses so as to join the ceramic plates 12 to the substrate 3 by surface joining, thereby securing gastightness. In this case, the height of the package 1b can be reduced. In addition, since the ceramic plates 12 are surface-joined to the substrate 3, the recesses can be formed such that the width of their openings is sufficiently larger than the width (length) of the ceramic plates 12. Thus, it becomes unnecessary to strictly control the dimensional accuracy of the recesses.

In the above-described embodiments, the ceramic member is the ceramic plate 12 having a plate-like shape. However, the ceramic member is not required to have a plate-like shape, so long as the ceramic member has at least a plate-shaped portion which can be surface-joined to the substrate 3. For example, the ceramic member may be a ceramic member which has tubular portions vertically extending from the facing front surface 13 of the ceramic-plate 12 and surround the openings on the facing front surfaces 13. In such a modified embodiment, the tubular portions are inserted into the first through holes 11 of the substrate 3, and the plate-shaped portion of the ceramic member is surface-joined to the substrate 3. Thus, the gastightness of the space inside the present package can be secured. In addition, it is possible to prevent formation of a short circuit, which would otherwise be formed as a result of contact between the inner wall surface of a first through hole 11 and a lead pin extending through the first through hole 11.

In the above-described embodiments, the difference in coefficient of linear expansion between the ceramic members and the substrate 3 is 5 ppm ($K^{-1}$) or less. However, the difference in coefficient of linear expansion is not limited thereto, so long as gastightness is secured at the joining interface between each ceramic member and the substrate 3. For example, in the case where the maximum length of the joining interface between each ceramic member and the substrate 3 as measured along a straight line is 5 mm or less, joining which can secure gastightness is possible even when the difference in coefficient of linear expansion between the ceramic members and the substrate 3 is greater than 5 ppm ($K^{-1}$).

Each ceramic member may be surface-joined to the substrate 3 in a state in which a member for reducing stress is interposed between the ceramic member and the substrate 3. In this case, joining which can secure gastightness is possible even when the difference in coefficient of linear expansion is rendered greater than 5 ppm ($K^{-1}$).

According to the present invention, there can be provided, without fail, a light-emitting device mounting package which can readily increase the amount of electric power supplied to a light-emitting device which is mounted inside the package at a later time and can reliably maintain the gastightness of the space inside the package.

DESCRIPTION OF REFERENCE NUMERALS 1a, 1b: light-emitting device mounting package
3: substrate
4: front surface
5: back surface
11: first through hole
12, 12a: ceramic plate (ceramic member, insulating member)
13: facing front surface
14: facing back surface
15, 15a: second through hole
16: metallized layer
17: separation region
19: third through hole
20: radiator
22: upper surface (mounting portion)
23: flange
28: brazing material layer
30: lead pin
33: head portion
34: collar portion
D1-D3: diameter

What is claimed is:

1. A package for mounting a light-emitting device comprising:
    a substrate having a front surface and a back surface that opposes the front surface, the substrate defining a first through hole which extends between the front surface and the back surface, and the substrate including a mounting portion for a light-emitting device at a front surface side of the substrate;
    an insulating member which has a facing front surface facing the front surface of the substrate or the back surface of the substrate and a facing back surface facing in a direction opposite a direction in which the facing front surface faces, the insulating member fixed to a region of the front surface of the substrate or a region of the back surface of the substrate around an opening of the first through hole, the insulating member defining a second through hole which extends between the facing front surface and the facing back surface; and
    a lead pin supported by the substrate, the lead pin including a shaft portion which penetrates the first through hole of the substrate and the second through hole of the insulating member, a collar portion which extends from the shaft portion in a radial direction, and a head portion provided at one axial end of the shaft portion, the lead pin fixed, via the collar portion, to a region of the facing back surface of the insulating member around an opening of the second through hole;
    wherein the collar portion of the lead pin has a diameter greater than a diameter of the shaft portion, and the head portion of the lead pin has a diameter greater than the diameter of the shaft portion.

2. A package for mounting a light-emitting device according to claim 1, wherein the insulating member is a ceramic member.

3. A package for mounting a light-emitting device according to claim 2, wherein the ceramic member is fixed to the substrate via a metallized layer formed on the facing front surface of the ceramic member surrounding and spaced from an opening of the second through hole, and a brazing material layer disposed on and along the metallized layer.

4. A package for mounting a light-emitting device according to claim 1, wherein
    the mounting portion for the light-emitting device is separated from the substrate and is a portion of a radiator having a thermal conductivity higher than a thermal conductivity of the substrate; and
    the substrate defines a third through hole which extends between the front surface and the back surface and into which the radiator is fixedly inserted.

5. A package for mounting a light-emitting device according to claim 4, wherein
    in plan view, the third through hole has a rectangular shape, a square shape, or a circular shape; and
    the radiator has a rectangular parallelepiped shape, a cubic shape, or a circular columnar shape and includes a flange which extends along a periphery of a bottom surface of the radiator and which can be joined to a region of the back surface of the substrate around an opening of the third through hole.

6. A package for mounting a light-emitting device according to claim 2, wherein a difference in coefficient of linear expansion between the substrate and the ceramic member is 5 ppm ($K^{-1}$) or less.

* * * * *